March 10, 1959 A. W. DONALD III 2,877,310

SEMICONDUCTOR AMPLIFIERS

Filed Sept. 30, 1957

INVENTOR

Alexander W. Donald, III

BY Sughrue & Rothwell

ATTORNEYS

United States Patent Office 2,877,310
Patented Mar. 10, 1959

2,877,310
SEMICONDUCTOR AMPLIFIERS

Alexander W. Donald III, Washington, D. C., assignor to Advanced Research Associates, Inc.

Application September 30, 1957, Serial No. 687,268
3 Claims. (Cl. 179—171)

The present invention relates generally to signal translating and amplifying circuits which employ direct-coupled semiconductor devices as active elements therein, and more particularly to means for stabilizing such circuits with variations in temperature.

Circuits which employ semiconductor devices such as transistors in direct-coupled configurations are often limited in application as a result of the temperature instability of such circuits. Where the semiconductor devices are self-biased by means of resistance elements placed in their base-emitter circuits, the effects of temperature changes are even more noticeable. Temperature instability of such circuits results primarily from variation of the collector current with zero emitter current hereinafter referred to as collector saturation current. The collector saturation current of a transistor is thermally generated in the base region of the transistor and is not effected by the input elements or base-emitter elements of the transistor. It is well known to those skilled in the seimconductor art that collector saturation current of a transistor increases with temperature. Any external resistance in the base-emitter circuit of a transistor will effectively increase the effect of the saturation current since the saturation current flowing through this external base-emitter resistance tends to bias the base-emitter junction in the forward direction. Thus, without stabilization any increase in the collector saturation current is amplified by the transistor to produce a further increase in the collector current thereof. This increase in collector current can, in power amplifiers, result in internal heating of the transistor which may be sufficiently regenerative to destroy the transistor. However, even if the transistor is not destroyed, the collector saturation current variation may alter the bias voltages appearing at the various electrodes sufficiently to result in unsatisfactory operation of the transistor circuit.

It is an object of the present invention to provide a stable semiconductor signal translating circuit utilizing direct-coupled semiconductor devices.

It is a further object of the present invention to provide an improved temperature stabilized semiconductor signal amplifier circuit employing at least two direct-coupled semiconductor devices of opposite conductivity types.

It is a still further object of the present invention to provide a direct-coupled signal amplifier circuit in which a pair of semiconductor devices of opposite conductivity types are directly coupled in a circuit which provides for stabilization of the operating point with a variation in collector saturation current.

In accordance with the present invention, a semiconductor amplifier is provided with first and second semiconductor devices of opposite conductivity types. Each of the devices includes an emitter electrode, a base electrode and a collector electrode. A direct current conductive impedance element is connected between the base electrode of the second device and the emitter electrode of the first device. Direct current conductive means is connected between the first base and the second collector electrodes, whereby the collector and base circuit of the second device provides a non-linear impedance to the collector saturation current of the first semiconductor device for stabilizing the amplifier with varying temperatures. An input signal is applied across the base and emitter electrodes of the second semiconductor device and a load impedance element is coupled to the emitter and collector electrodes of the first semiconductor device for deriving an output signal therefrom.

The novel features which are believed to be characteristic of the invention both as to its organization and method of operation, together with the further objects and advantages thereof, will be better understood from the following description considered in connection with the accompanying drawing in which.

Figure 1:
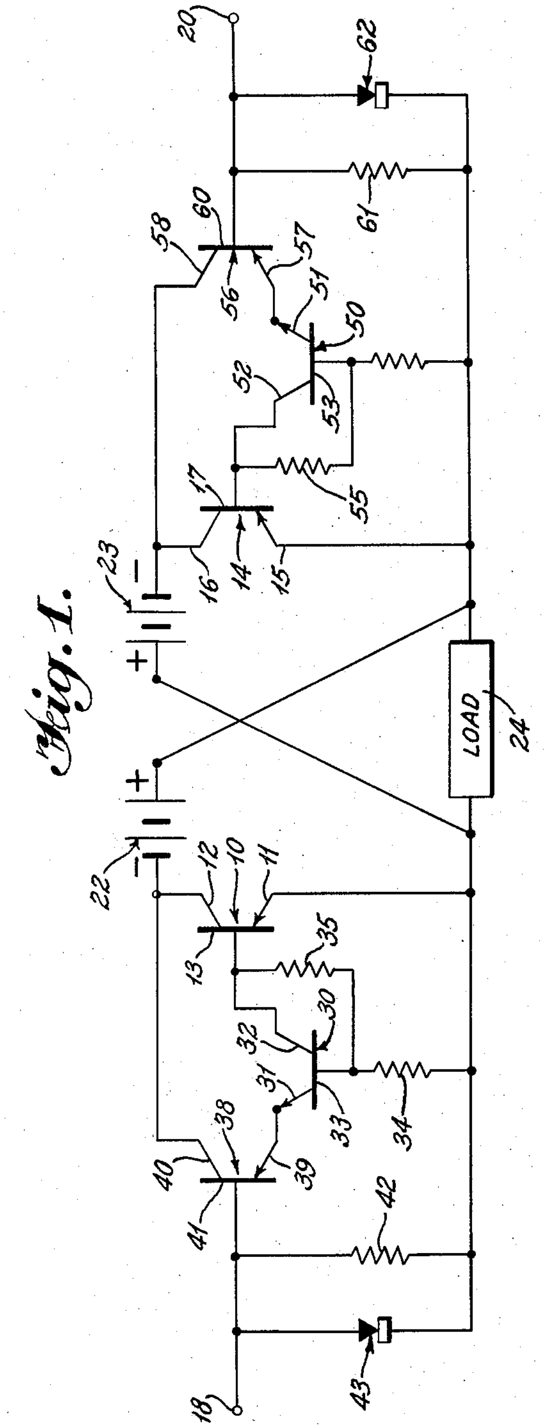
Fig. 1 is a schematic circuit diagram of a balanced bridge semiconductor amplifier circuit employing the principles of the present invention.
Figure 2:
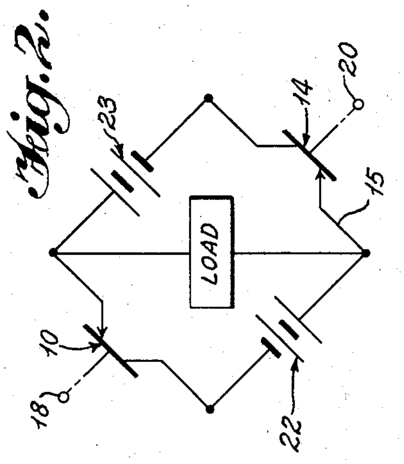
Fig. 2 is a simplified schematic circuit diagram of the bridge circuit shown in Fig. 1.

Referring now to the drawing wherein like reference characters are used to designate like elements throughout the various figures, and particularly to the amplifier circuit shown in Fig. 1, a pair of semiconductor devices of the PNP conductivity type such as junction transistors 10 and 14 are provided as two arms of a bridge circuit. The transistor 10 includes an emitter electrode 11, a collector electrode 12, and a base electrode 13, and the transistor 14 includes an emitter electrode 15, a collector electrode 16 and a base electrode 17. A pair of input terminals 18 and 20 are provided for energizing the bridge amplifier from any suitable source of alternating current or direct current potential. A pair of suitable direct current energizing sources such as batteries 22 and 23 complete the other two arms of the bridge. As is shown, the negative terminal of the battery 22 is connected to the collector 12 and the positive terminal of the battery 22 is connected to the emitter 15. The positive terminal of the battery 23 is connected to the emitter 11 and the negative terminal of the battery 23 is connected to the collector 16. A load impedance element illustrated as a resistor 24 is connected across two arms of the bridge or between the emitter electrodes 11 and 15. The relative positions of the elements of the bridge circuit of Fig. 1 discussed above may be readily observed by referring to Fig. 2 which is a simplified circuit diagram of these elements.

Referring again to Fig. 1, a temperature stabilizing semiconductor device 30 of an opposite conductivity type with respect to the semiconductor devices 10 and 14, is provided to stabilize the bias voltage applied to the base and emitter electrode of the transistor 10. This semiconductor device which may be a junction transistor is of the NPN type and includes an emitter electrode 31, a collector electrode 32 and a base electrode 33.

The transistor 10 is self-biasing in that the operating bias for the base-emitter junction thereof is obtained by the voltage drop resulting from the collector saturation current thereof flowing through three direct current (D. C.) conductive impedance elements connected between the base and emitter electrodes 13 and 11 respectively. One of the D. C. conductive impedance elements is a bias resistor 34 which is connected between the base electrode 33 and the emitter electrode 11. The other two D. C. conductive impedance elements comprise the parallel connected bias resistor 35 and the collector-base junction of the transistor 30. As is shown, the collector 32 and one terminal of the resistor 35 are connected to the base 13.

An input transistor 38 including an emitter electrode 39, a collector electrode 40 and a base electrode 41 is provided for controlling the operation of the transistor 30. The transistor 38 may also be a junction transistor and is of the PNP variety. The emitter electrode 39 is directly coupled to the emitter electrode 31 and the base electrode 41 is directly coupled to the input terminal 18. A base bias resistor 42 is connected between the base electrode 41 and the emitter electrode 11 and an asymmetrically conductive device 43, such as a semiconductor diode, is connected in parallel with resistor 42 with its anode being connected to the base electrode 41 for providing a low impedance for positive signals that are applied at the input terminal 18 as will be explained. The collector electrode 40 is connected to the negative terminal of the battery 22 to be energized thereby.

A second temperature stabilizing semiconductor device 50 such as a junction transistor of the NPN variety is coupled to the base-emitter circuit of the transistor 14 for providing stable operation of the transistor 14 with varying temperature. The transistor 50 includes an emitter electrode 51, a collector electrode 52 and a base electrode 53. Three D. C. conductive impedance elements including the base-emitter junction of the transistor 50 are connected between the base and emitter electrodes of the transistor 14 to effect self-biasing of the transistor 14 in a manner similar to the biasing arrangement of the transistor 10. The collector electrode 52 is directly coupled to the base electrode 17 and the base electrode 53 is coupled to the emitter electrode 15 by means of a D. C. conductive impedance element 54 such as a resistor. Another D. C. conductive impedance element 55 such as a resistor, is connected in parallel with the collector and base electrodes 52 and 53 respectively to provide proper bias for the base-emitter circuit of the transistor 14. An input transistor 56 of the PNP variety is provided to control the operation of the transistor 50 which in turn controls the operation of the transistor 14. This input transistor 56 is of the junction type and includes an emitter electrode 57, a collector electrode 58 and a base electrode 60. A base bias resistor 61 is connected between the base 60 and the emitter 15 to provide base-emitter bias for the transistor 56. An asymmetrically conductive device 62, such as a semiconductor diode, is connected in parallel with resistor 61 with its anode being connected to the base electrode 60 to provide a low impedance for positive signals that are applied at the terminal 20.

Figure 3:
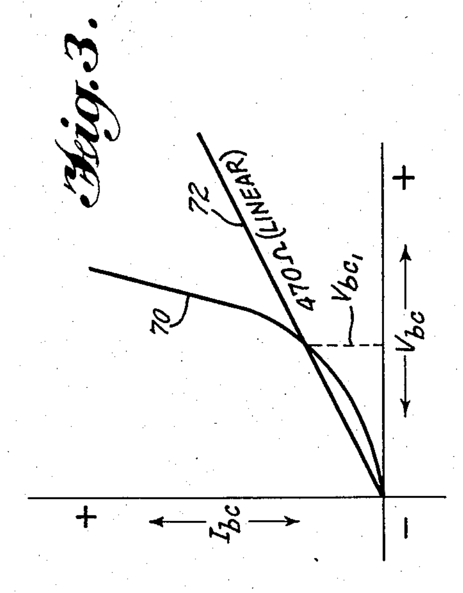
Fig. 3 is a graph illustrating the current flow through two elements of the circuit of Fig. 1.

In discussing the operation of the circuit of Fig. 1, reference is now made to the graph of Fig. 3 wherein the abscissa represents voltage and the ordinate current. The curve 70 represents the current flow through the collector-base junction of the transistors 30 or 50 with various voltages being applied across the junction and the curve 72 illustrates the current flow through the bias resistors 35 or 55 with various voltages being applied across the respective resistors.

The curves of Fig. 3 cross at a predetermined value of applied voltage ($V_{bc1}$) across the collector-base junction of the transistors 30 or 50. At this crossover point an equal amount of collector saturation current in the transistors 10 and 14 will flow through the collector-base junction of the transistors 30 and 50 respectively, and the resistors 35 and 55 respectively. As the collector saturation current in the transistors 10 and 14 increases, and thereby increase the voltage applied across the collector-base junctions of the transistors 30 and 50 beyond $V_{bc1}$, the current flow through the collector-base junctions of the transistors 30 and 50 will increase with little change in the voltage developed across these junctions. Thus, the bias voltages across the base-emitter circuits of the transistors 10 and 14 are stabilized with changes in the collector saturation current in these transistors.

The bias voltages in the base-emitter circuits of the transistors 10 and 14 are further stabilized with variations in temperature by the changes in the conductance of the forward biased collector-base junctions of the transistors 30 and 50 respectively. When the temperatures of the transistors 30 and 50 are increased, the conductance of the forward biased collector-base junctions of these transistors increase. This increase in conductance lowers the impedance across the collector-base junctions of the transistors 30 and 50 and thereby tends to decrease the bias voltage developed across these junctions due to the collector saturation current in the transistors 10 and 14. For this reason the stabilizing transistors 30 and 50 should be thermally coupled to the amplifying transistors 10 and 14 respectively.

In discussing the operation of the circuit of Fig. 1, let it be assumed that proper operating bias is established for all of the transistors and let it further be assumed that the temperatures of the transistors 10, 14, 30 and 50 are increasing due to an increase in ambient temperature or internal heating of the transistors 10 and 14. This results in an increasing collector saturation current in the transistors 10 and 14 and also in an increasing conductance of the forward biased collector-base junctions of the transistors 30 and 50. The increasing conductance of the collector-base junction of the transistor 30 lowers the impedance in the base-emitter circuit of the transistor 10 and thereby tends to adjust the bias current flowing in the transistor 10 to cut off the transistor 10 or reduce the current flowing therethrough. The collector-base junction of the transistor 50 similarly stabilizes the operation of the transistor 14.

Assuming that the bridge amplifier of Fig. 1 is initially balanced so that the currents flowing in the collectors of the transistors 10 and 14 are equal, the current flowing through the load resistor 24 is zero in the absence of a signal applied across the input terminals 18 and 20. At this time the transistors 30, 38, 50 and 56 are non-conducting due to their respective base-emitter junctions being biased in the reverse direction. Let it be assumed that a positive input signal is now applied between the terminals 18 and 20, wherein the terminal 18 is rendered more positive than the terminal 20. This signal renders the anode of the diode 43 more positive than its cathode and thereby biases the diode 43 in the forward direction. This input signal also maintains the transistors 38 and 30 nonconducting by maintaining their respective emitter-base junctions biased in the reversed direction.

The voltage between the cathode of the diode 43 and the terminal 20 resulting from this input signal drives the base 60 negative with respect to the emitter 15. Assuming that the input signal has sufficient magnitude to drive the base 60 negative with respect to the base 53, the base-emitter junctions of the transistors 50 and 56 are biased in the forward direction thereby rendering the transistors 50 and 56 conducting. When the transistor 50 is rendered conducting as a result of its emitter electrode being driven more negative than its collector and base electrodes, the collector-base junction of this transistor is biased in the reverse direction and current flows from the collector electrode 52 to the emitter electrode 51.

The current flow through the collector and emitter electrodes of the transistor 50 drives the base 17 or the collector 52 to a negative potential with respect to the emitter 15 which in turn renders the transistor 14 conducting and current flows from the battery 23 through the load 24 and the transistor 14.

Upon the application of an input signal which drives the terminal 18 negative with respect to the terminal 20, the transistors 50, 56 and 14 will be turned off and the transistors 38, 30 and 10 will be turned on in the same manner that the transistors 50, 56 and 14 were rendered conducting by negative signal applied at the terminal 20. Thus the circuit of Fig. 1 is a balanced bridge amplifier in which a signal of one polarity will cause current to flow through the load resistor 24 in one direction and an input signal of the opposite polarity will cause current to flow through the load resistor 24 in the opposite direction.

While the semiconductor devices 10, 14, 38 and 56 have been illustrated as junction transistors of the PNP variety, and the semiconductor devices 30 and 50 have been illustrated as junction transistors of the NPN variety, the semiconductor devices 10, 14, 38 and 56 could be replaced with NPN transistors and the semiconductor devices 30 and 50 could be replaced with PNP transistors by making appropriate changes in the connections to the batteries 22 and 23.

It is to be understood that the principles of the present invention apply not only to amplifier circuits such as the one disclosed in Fig. 1, but also to other direct-coupled transistor amplifier circuits in which at least two transistors of opposite conductivity type are used as active elements. To provide direct current operating stabilization of such circuits it is necessary that the collector-base junction of the stabilizing transistor is connected in the base-emitter circuit of the amplifying or signal translating transistor to conduct a portion of the collector saturation current in the amplifying transistor through the collector-base junction of the stabilizing transistor.

Obviously, the transistors 10 and 30 could be operated separately without the remaining transistors and their associated components in the circuit of Fig. 1. Under these circumstances an input signal applied between the emitter 31 and the emitter 11 would render the transistors 30 and 10 operative to amplify the input signal and an output signal could be derived across the collector and emitter electrodes of the transistor 10. Such combinations of direct-coupled transistors of opposite conductivity types could be cascaded or connected in other suitable configurations to provide for temperature stabilization of the amplifying or signal translating transistors.

Thus it is seen that by providing a pair of semiconductor devices of opposite conductivity types in a direct-coupled arrangement and in which the collector and base electrodes of one of the transistors are direct current conductively coupled in the base and emitter circuit of the other transistor, direct current stabilization of the operating point of the circuit is obtained.

What is shown and described is the specific embodiment of the present invention. Other embodiments obvious from the teachings herein to those skilled in the art are contemplated to be within the spirit and scope of the following claims.

What is claimed is:

1. A transistor amplifier comprising in combination: a first transistor of one conductivity type including a first base, a first emitter and a first collector; a second transistor of an opposite conductivity type including a second base, a second emitter and a second collector; a third transistor of said one conductivity type including a third base, a third emitter and a third collector; direct current energizing means coupled between said first collector and said first emitter for applying a reverse bias between said first collector and said first emitter, said second collector being directly coupled to said first base; first direct current conductive impedance means connected between said second base and said first emitter; second direct current conductive impedance means connected between said first base and said second base; direct current conductive circuit means connected between said first and third collectors, said third emitter being directly coupled to said second emitter; third direct current conductive impedance means connected between said third base and said first emitter; input means coupled to said third base and said first collector for applying an input signal to said third transistor; and output means coupled to said first collector for deriving an output signal therefrom.

2. A transistor balanced bridge amplifier comprising in combination: a first, second, third and fourth transistor of one conductivity type; a fifth and sixth transistor of an opposite conductivity type, each of said transistors including a base electrode, an emitter electrode and a collector electrode; a first source of direct energizing potential connected between the collector electrode of said first transistor and the emitter electrode of said second transistor; a second source of energizing potential connected between the collector electrode of said second transistor and the emitter electrode of said first transistor; a load impedance connected between the emitter electrodes of said first and second transistors; the collector electrodes of said fifth and sixth transistors being connected to the base electrodes of said first and second transistors respectively; a first resistance element connected between the base of said fifth transistor and the emitter electrode of said first transistor; a second resistive element connected between the base electrode of said fifth transistor and the base electrode of said first transistor; a third resistance element connected between the base electrode of said sixth transistor and the emitter electrode of said second transistor; a fourth resistance element connected between the base electrode of said sixth transistor and the base electrode of said second transistor; the collector electrodes of said third and fourth transistors being connected to the collector electrodes of said first and second transistors respectively, the emitter electrodes of said third and fourth transistors being connected to the emitter electrodes of said fifth and sixth transistors respectively; a fifth resistance element connected between the base electrode of said third transistor and the emitter electrode of said first transistor; a sixth resistance element connected between the base electrode of said fourth transistor and the emitter of said second transistor; a first asymmetrically conductive element connected in parallel with said fifth resistance element; and a second asymmetrically conductive element connected in parallel with said sixth resistance element and input means connected to said base of each of said third and said fourth transistors.

3. A transistor amplifier comprising in combination: a first transistor of one conductivity type including a first base, a first emitter and a first collector; a second transistor of an opposite conductivity type including a second base, a second emitter and a second collector; a source of direct current energizing potential and a load impedance element connected in the order named between said first collector and said first emitter, said second collector being connected directly to said first base; a first resistor connected between said first base and said second base; a second resistor connected between said second base and said first emitter; and input means connected between said second emitter and said first collector for applying an input signal to said amplifier.

References Cited in the file of this patent

UNITED STATES PATENTS

| | | |
|---|---|---|
| 2,751,545 | Chase | June 19, 1956 |
| 2,801,296 | Blecher | July 30, 1957 |

OTHER REFERENCES

Sziklai et al: "A Study of Transistor Circuits for Television," Proc. IRE, June 1953, pp. 708–717. Copy in Class 179–171MB.

Penfield: "Transistorized Guitar Amplifier," Radio and Television News, July 1956, pp. 43–45. Copy in Class 179–171MB.